US008994463B2

(12) United States Patent
Yi et al.

(10) Patent No.: US 8,994,463 B2
(45) Date of Patent: Mar. 31, 2015

(54) PUSH-PUSH OSCILLATOR CIRCUIT

(75) Inventors: Yin Yi, Munich (DE); Hao Li, Poing (DE); Saverio Trotta, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/814,764

(22) PCT Filed: Aug. 26, 2010

(86) PCT No.: PCT/IB2010/053850
§ 371 (c)(1),
(2), (4) Date: Feb. 7, 2013

(87) PCT Pub. No.: WO2012/025791
PCT Pub. Date: Mar. 1, 2012

(65) Prior Publication Data
US 2013/0141175 A1    Jun. 6, 2013

(51) Int. Cl.
*H03B 5/18*    (2006.01)
*H02M 7/5383*    (2007.01)
(Continued)

(52) U.S. Cl.
CPC ......... *H02M 7/53835* (2013.01); *H03B 5/1847* (2013.01); *H03B 25/00* (2013.01); *H03B 5/1231* (2013.01); *H03B 5/1209* (2013.01);
(Continued)

(58) Field of Classification Search
USPC ....... 331/96, 117 V, 176, 117 R, 117 FE, 167
See application file for complete search history.

(56) References Cited

U.S. PATENT DOCUMENTS 4,763,084 A * 8/1988 Pavio et al. ............ 331/56
6,066,997 A * 5/2000 Matsugatani et al. ........ 333/218
(Continued)

FOREIGN PATENT DOCUMENTS

JP    2000-223944 A    8/2000
JP    2010-074598 A    4/2010

OTHER PUBLICATIONS

P.R. et al. "A Monolithic Integrated 180 GHz SiGe HBT Push-Push Oscillator", Gallium Arsenide and Other Semiconductor Application Symposium, 2005, pp. 341-343.
(Continued)

*Primary Examiner* — Jospeh Chang
*Assistant Examiner* — Jeffrey Shin

(57) ABSTRACT

A push-push oscillator circuit with a first oscillation branch with a first active device and a first tank adapted to provide a signal having a fundamental frequency $f_0$, a second oscillation branch with a second active device and a second tank symmetrical to the first oscillation branch and adapted to provide a signal having the fundamental frequency $f_0$. Output branches are coupled to the first oscillation branch and the second oscillation branch to provide signals having the second harmonic frequency $2f_0$ of the fundamental signal based on the signals having the fundamental frequency $f_0$ and/or to provide signals having the fundamental frequency $f_0$; The push-push oscillator circuit further comprises at least one terminal branch with a terminal adapted to provide a component of a differential signal having the second harmonic frequency $2f_0$ or the fundamental frequency $f_0$. The at least one terminal branch comprises a RF stub.

19 Claims, 1 Drawing Sheet

(51) Int. Cl.
*H03B 25/00* (2006.01)
*H03B 5/12* (2006.01)

(52) U.S. Cl.
CPC ............ *H03B 5/124* (2013.01); *H03B 5/1218* (2013.01); *H03B 2200/007* (2013.01)
USPC ................. 331/96; 331/107 SL; 331/117 FE; 331/167; 331/177 R; 331/177 V

(56) References Cited

U.S. PATENT DOCUMENTS

| | | | |
|---|---|---|---|
| 6,275,118 | B1 | 8/2001 | Saito et al. |
| 6,310,522 | B1 * | 10/2001 | Wang et al. ................... 331/56 |
| 7,053,722 | B2 | 5/2006 | Rein |
| 7,463,106 | B2 | 12/2008 | Shin et al. |
| 2005/0046500 | A1 | 3/2005 | Rohde et al. |
| 2006/0033590 | A1 * | 2/2006 | Shigematsu .............. 331/177 V |
| 2007/0120615 | A1 * | 5/2007 | Rohde et al. .................. 331/176 |
| 2008/0143447 | A1 * | 6/2008 | Watanabe et al. ............... 331/46 |
| 2010/0090770 | A1 * | 4/2010 | Matsuo ........................... 331/47 |
| 2011/0267147 | A1 | 11/2011 | Trotta |

OTHER PUBLICATIONS

C.C. et al. "192 GHz Push-Push VCO in 0.13 μm CMOS", Electronics Letters, Nov. 2006, pp. 208-210.

C.H.C. et al. "A Low Phase Noise 26-GHz Push-Push VCO with a Wide Tuning Range in 0.18-um CMOS Technology", Proceedings of Asia-Pacific Microwave Conference 2006, pp. 1128-1131.

T.N. et al. "A 59GHz Push-Push VCO with 13.9GHz Tuning Range Using Loop-Ground Transmission Line for a Full-Band 60GHz Transceiver", ISSCC, 2009, pp. 496-498.

International Search Report and Written Opinion correlating to PCT/IB2010/053850 dated May 4, 2011.

* cited by examiner

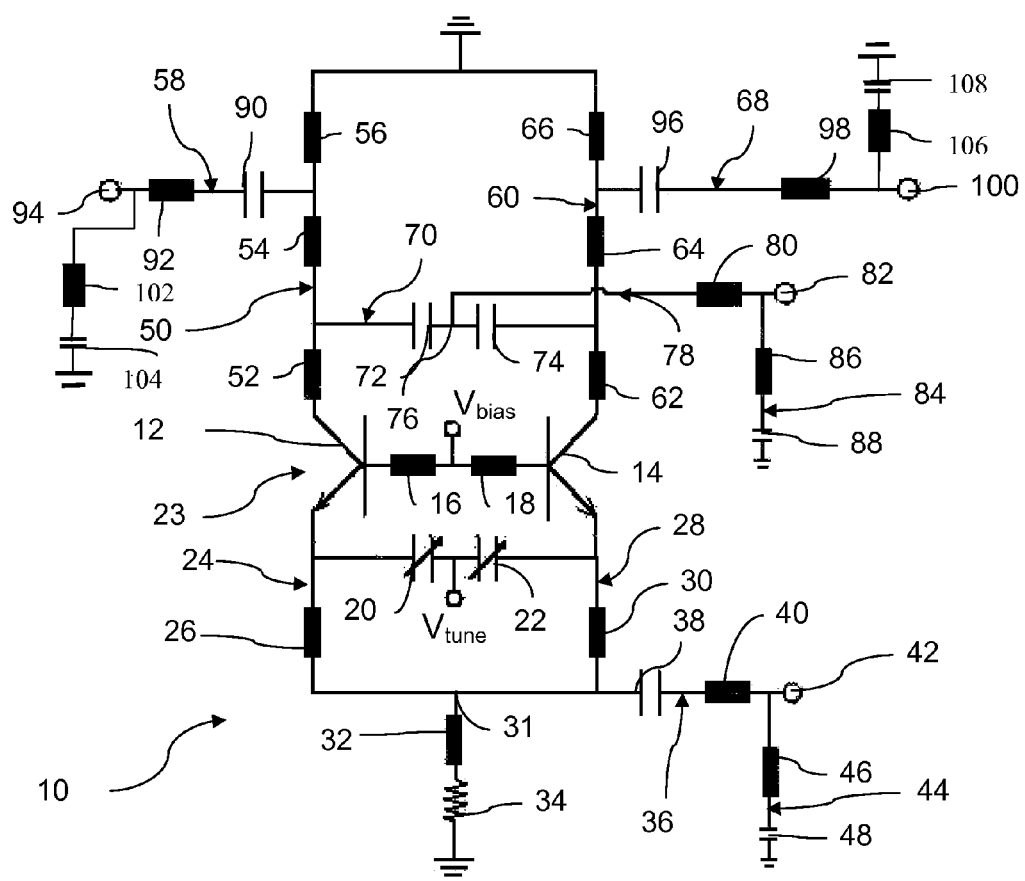

PUSH-PUSH OSCILLATOR CIRCUIT

FIELD OF THE INVENTION

This invention relates to a push-push oscillator circuit.

BACKGROUND OF THE INVENTION

A push-push oscillator is an electronic device generally comprising two symmetrical balanced branches with the same fundamental frequency and opposite phase of oscillation. A push-push oscillator is formed by combining two balanced branches in such a way that the fundamental frequency signals are cancelled out while their second harmonic components, respectively at twice the fundamental frequency, are constructively summed and delivered to a load. A push-push oscillator may be used to provide signals having the second harmonic frequency without the need of an additional frequency multiplier. To get signals having the fundamental frequency and the second harmonic frequency, special techniques have to be applied. A known push-push oscillator with dual full-differential outputs is e.g. described in US 2007/0182502 A1.

SUMMARY OF THE INVENTION

The present invention provides a push-push oscillator circuit as described in the accompanying independent claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 schematically shows an example of an embodiment of a push-push oscillator.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention. It should be noted that in the context of this specification, a differential signal may comprise two components having the same amplitude and opposite phase. A differential signal may be provided via two terminals. A transmission line may be the material medium or structure that forms all or part of a path from one place to another for directing the transmission of electromagnetic energy. As a transmission line may have impedance, it may be considered to be an inductor. As an electrical or electromagnetic signal may be transported through an inductor, an inductor may be considered to be a transmission line, if it has lower impedance for a signal having different frequency. A quarter-wavelength transmission line may be considered to be a transmission line whose electrical length for a given frequency is one quarter-wavelength long or close to one quarter-wavelength long, or an odd multiple of such a wavelength, with essentially infinite (or high) impedance for a signal having a given frequency. In the context of this specification, a quasi-quarter-wavelength transmission line may be considered to be a quarter-wavelength transmission line. An inductor with high or essentially infinite impedance for a signal having a given frequency may be considered as a quarter-wavelength transmission line. A quarter-wavelength transmission line may provide very high impedance for a signal having a given frequency, essentially blocking such a signal, but allow transmission of a signal having a lower or higher frequency.

A push-push oscillator circuit may comprise a first oscillation branch and a second oscillation branch. Each oscillation branch may comprise an active device and a tank. In particular a first active device may be associated to the first oscillation branch and a second active device may be associated to the second oscillation branch. A tank may comprise an inductor and/or a capacitor, in particular a varactor. The oscillation branches may be symmetrically balanced. Each branch may be adapted to provide a signal having a fundamental frequency $f_0$, which may depend on oscillatory characteristics of the branch, in particular, on the capacitance and inductance of a branch. It may be considered that both oscillation branches share an inductor. The oscillation branches may have components with equal or essentially equal electromagnetic characteristics, in particular with respect to inductance, capacitance and reaction to changes in applied voltages and currents. The fundamental frequency $f_0$ may be tuneable, e.g. by changing a tuning voltage. It may be considered that the symmetrically balanced branches combined represent a push-push oscillator core, since the second harmonic frequency $2f_0$, which may also be called push-push frequency, may be generated at the common combination point. A push-push oscillator core may be seen as a voltage controlled oscillator. It may be an alternating voltage driven oscillator or a direct voltage driven oscillator. It may be envisioned to use any kind of tuneable tank to provide a tuneable frequency. The signals having fundamental frequency $f_0$ of the symmetrically balanced branches may be constructively summed to produce a signal at the second harmonic of the fundamental frequency, i.e. at double the fundamental frequency $2f_0$, while the fundamental frequency signals are cancelled out at least to a large degree.

A push-push oscillator circuit may provide signals having frequencies $f_0$ and $2f_0$, respectively. Of each oscillation branch there may branch off three output branches. Output branches branching off of different oscillation branches may overlap respectively be connected to each other. It may be considered that the push-push output branches are two common source terminals of the first oscillation branch and the second oscillation branch to provide signals having the balanced second harmonic frequency $2f_0$ of the fundamental signal based on the signals having the balanced fundamental frequency $f_0$. The third output branch of each oscillation branch may be adapted to provide signals having the fundamental frequency $f_0$ by decoupling the signal components of the second harmonic frequency. Of each oscillation branch there may branch off at least two output branches. In particular, output branches connected to one oscillation branch may branch off of a different terminal of an active device of the oscillation branch.

It may be considered that the push-push oscillator circuit comprises at least one terminal branch with a terminal adapted to provide a component of a differential signal having the second harmonic frequency $2f_0$ or the fundamental frequency $f_0$. The at least one terminal branch may comprise a RF stub comprising a quarter-wavelength transmission line for a signal having the second harmonic frequency $2f_0$ or the fundamental frequency $f_0$. It may be considered that the quarter-wavelength transmission line for a signal having the second harmonic frequency $2f_0$ or the fundamental frequency $f_0$ of the RF stub comprises a microstrip. The RF stub may be coupled to a connection point between an inductor of the terminal branch and the terminal. It may be contemplated that the RF stub comprises a capacitor coupled in series with the quarter-wavelength transmission line.

More specifically, the push-push oscillator circuit may comprise a first terminal branch with a first second harmonic frequency terminal and a second terminal branch with a second second harmonic frequency terminal adapted to provide a differential signal having the second harmonic frequency $2f_0$. It may be considered that each of the second harmonic frequency terminals provides a component of the differential signal having the second harmonic frequency $2f_0$. The first terminal branch and/or the second terminal branch may comprise a RF stub. A RF stub of the first terminal branch and/or a RF stub of the second terminal branch may comprise a quarter-wavelength transmission line for a signal having the second harmonic frequency $2f_0$. It may be contemplated that the push-push oscillator circuit alternatively or additionally comprises a first fundamental frequency terminal branch with a first fundamental frequency terminal and a second fundamental frequency terminal branch with a second fundamental frequency terminal adapted to provide a differential signal having the fundamental frequency $f_0$. It may be considered that each of the fundamental frequency terminals provides a component of the differential signal having the fundamental frequency $f_0$. The first fundamental frequency terminal branch and/or the second fundamental frequency terminal branch may comprise a RF stub. A RF stub of the first fundamental frequency terminal branch and/or a RF stub of the second fundamental frequency terminal branch may comprise a quarter-wavelength transmission line for a signal having the fundamental frequency $f_0$.

Generally, one of the output branches may comprise two coupling inductors and a first fundamental frequency branch with a first fundamental frequency terminal. The first fundamental frequency branch may be coupled in series to one of the two coupling inductors. The two coupling inductors may be coupled to each other in series via a first connection point. This output branch may be connected to the first oscillation branch, in particular to the active device of the first oscillation branch. Another one of the output branches may comprise two coupling inductors and a second fundamental frequency branch with a second fundamental frequency terminal. The second fundamental frequency branch may be coupled in series to one of two coupling inductors. The two coupling inductors of this output branch may be coupled to each other in series via a second connection point. This output branch may be connected to the second oscillation branch, in particular to a terminal of the active device of the second oscillation branch. The push-push-oscillator circuit may be adapted to provide a differential signal having the fundamental frequency $f_0$ via the first and second fundamental frequency terminals. It may be considered that each of the first and second fundamental frequency terminals provides one component of the differential signal.

A push-push oscillator circuit may comprise two common source terminals: a first terminal with a first second harmonic frequency and a second terminal with a second second harmonic frequency, adapted to provide a differential signal having the second harmonic frequency $2f_0$. The terminals may be connected to the two balanced oscillation branches with coupled connection branches for the signals having the second harmonic frequency $2f_0$. It may be envisioned that the first common source terminal may be coupled via transmission lines; the second common source terminal may be coupled via two capacitors. The connection branch may comprise two quarter-wavelength transmission lines for a signal having the fundamental frequency $f_0$ adapted to dampen out the signal having the fundamental frequency $f_0$.

The push-push oscillator may comprise a first terminal branch with a first second harmonic frequency terminal and a second terminal branch with a second second harmonic frequency terminal adapted to provide a differential signal having the second harmonic frequency $2f_0$.

The first terminal branch may be connected to at least one output branch and the second terminal branch may be connected to at least one of the other output branches. It may be envisioned that the first connection point and the second connection point are coupled via a connection branch. It is feasible that the second terminal branch is being coupled to the connection branch. The connection branch may comprise a first capacitor and a second capacitor adapted to provide a virtual ground for a signal having the fundamental frequency $f_0$. The capacitors may be adapted to sum the signals having the second harmonic frequency $2f_0$. In particular, they may be adapted to provide signals having the second harmonic frequency $2f_0$ with the same phase at a connection point. The connection point may be located between the capacitors of the connection branch.

In particular, as shown in the example of FIG. 1, a push-push oscillator circuit 10 may comprise two active devices, in this case first transistor 12 and second transistor 14. Any kind of transistor or suitable active device may be used. The active devices respectively transistors 12, 14 may be identical in respect to their specifications to provide symmetrical active devices. In particular, the transistors 12, 14 may be bipolar junction transistors. It may be contemplated to use transistors suitable for high frequencies for or as active devices, in particular npn-transistors respectively NMOS (n-type metal-oxide semiconductor) transistors. The base of transistor 12 may be connected to a bias voltage $V_{bias}$ via an inductor 16. It is feasible that the base of transistor 14 is connected to bias voltage $V_{bias}$ via an inductor 18. It may be considered that inductors 16 and 18 have identical characteristics. In particular, inductors 16 and 18 may have identical inductances. Biasing voltage $V_{bias}$ may be chosen in any suitable way to bias the base voltages of the transistors 12, 14.

A tuning voltage source may be arranged to provide a tuning voltage $V_{tune}$ to transistors 12, 14. Between the tuning voltage source and the emitter of transistor 12 there may be a coupled a capacitor 20, which may be a varactor. It is feasible to connect a capacitor 22, which may be a varactor, between the emitter of transistor 14 and the tuning voltage source. Capacitor 20 and/or capacitor 22 may be tuneable in regards to their capacitance by changing the tuning voltage. It is feasible to choose the capacitances of capacitors 20, 22 to be equal. The capacitors may have an essentially identical reaction to a changing tuning voltage over the range of tuning voltages which may be applied. Capacitors 20, 22, transistors 12, 14 and inductors 16, 18 may be seen as a representation of a push-push oscillator core 23 with a tuneable fundamental oscillator frequency $f_0$. The tuning voltage $V_{tune}$ may be a direct voltage. Transistor 12, inductor 16 and capacitor 20 may be seen as a first oscillation branch of a push-push oscillator core 23. Transistor 14, inductor 18 and capacitor 22 may be seen as a second oscillation branch of a push-push oscillator core 23. Inductor 16 and capacitor 20 may be considered to be a tank of the first oscillation branch. Inductor 18 and capacitor 20 may be considered to be a tank of the second oscillation branch. The first oscillation branch and the second oscillation branch may be symmetrical, so that each oscillation branch has an oscillatory frequency of $f_0$ and may provide a signal having this fundamental frequency $f_0$. It may be envisioned to utilize any kind of voltage controlled oscillator with two symmetrical branches as a push-push oscillator core 23. In particular, the oscillation branches may comprise any suitable combinations of components of active devices, inductors and capacitors to provide a signal at a fundamental frequency $f_0$, in particular a tuneable fundamental frequency $f_0$.

Connected to the first oscillation branch of the push-push oscillator core 23 may be a first output branch 24. First output branch 24 may branch off of a terminal of the active device of the first oscillation branch, in this case the emitter of first transistor 12. It may branch off between the emitter of transistor 12 and the capacitor 20. The first output branch 24 may comprise an inductor 26. A second output branch 28 may branch off of the second oscillation branch of the push-push oscillator core 23. The second output branch 28 may branch off a terminal of the active device of the second oscillation branch. In particular, it may be connected to the emitter of the second transistor 14. The second output branch may comprise an inductor 30 connected between the emitter of transistor 14 and the capacitor 22. Inductor 26 and/or inductor 30 may represent quarter-wavelength transmission lines for signals having the fundamental frequency $f_0$. It may be considered that inductor 26 and/or inductor 30 provide high impedance for a signal having frequency $f_0$ to dampen it respectively prevent it from passing further down the output branches 24 and/or 28. The first and second output branches 24, 28 may be connected to each other at a connection point 31. Branching off from connection point 31 may be a biasing branch comprising a quarter-wavelength transmission line 32 for a signal having the second harmonic frequency $2f_0$ connected in series to a resistor 34 connected to ground to bias the current in circuit 10 and provide high impedance for a signal having the second harmonic $2f_0$ in the biasing branch.

A first terminal branch 36 may branch off from connection point 31 respectively between inductor 30 and connection point 31. First terminal branch 36 may be considered to be a terminal branch connected to one or more than one output branches, in particular to the first and the second output branch. First terminal branch 36 may comprise a decoupling capacitor 38 to decouple the first terminal branch 36 from a DC component in circuit 10. Coupled in series behind decoupling capacitor 38 may be a phase shifting inductor 40 adapted to phase-shift a signal at second harmonic frequency $2f_0$, to which may be connected in series a first second harmonic terminal 42 at which a signal having the second harmonic frequency $2f_0$ may be provided respectively tapped off. The first second harmonic terminal 42 may be considered to output a signal having the second harmonic frequency $2f_0$. The output of the first second harmonic terminal 42 may be considered to be a component of a differential signal. Connected to a connection point between the first second harmonic terminal 42 and the phase shifting inductor 40 there may be connected a first RF stub 44. First RF stub 44 may be adapted to shorten the fundamental frequency $f_0$ signal at the terminal 42 and to enhance the signal at the second harmonic frequency $2f_0$. In particular, first RF stub 44 may comprise an inductor 46. Inductor 46 may represent a quarter-wavelength transmission line 46 for signals having the second harmonic frequency $2f_0$. Transmission line 46 may be coupled in series with a capacitor 48 and ground. First RF stub 44 may provide a short circuit connection for a signal at fundamental frequency $f_0$ and an open circuit connection with high impedance for a signal at second harmonic frequency $2f_0$. Thus, the signal quality with frequency $2f_0$ provided at the first second harmonic terminal 42 may be improved as it may comprise a weakened component at fundamental frequency $f_0$.

A third output branch 50 may branch off of the first oscillation branch of the push-push oscillator core 23. The third output branch 50 may branch off of a second terminal of the active device of the first oscillation branch. In particular, it may branch off from the collector of first transistor 12. The third output branch may comprise a first inductor 52, second inductor 54 and third inductor 56. First inductor 52, second inductor 54 and third inductor 56 may be connected in series. A first connection point may be provided between the first inductor 52 and the second inductor 54. First inductor 52 and second inductor 54 may be considered to be coupling inductors coupled in series. It may be envisioned that the first inductor 52 is adapted to allow signals having the fundamental frequency $f_0$ and the second harmonic frequency $2f_0$ to pass. In particular, it may be considered to adapt the first coupling inductor 52 not to be a quarter-wavelength transmission line for either the fundamental frequency $f_0$ or the second harmonic frequency $2f_0$. It may be envisioned that any of inductors 52, 54 and 56 individually or in any combination are adapted for compensating a parasitic capacitance of the push-push oscillator core 23. Inductors 52 and/or 54 and/or 56 may be adapted to provide or improve an output match for one output signal having the fundamental frequency $f_0$ or the second harmonic frequency $2f_0$ or for both output signals having the fundamental frequency $f_0$ and the second harmonic frequency $2f_0$, respectively. The quality factor of the tank respectively the oscillation branch may be increased by optimization of the inductors 52, 54 and 56. In particular, the amplitude of the output signal may be increased and/or the phase noise may be minimized, e.g. for the signal having the second harmonic frequency $2f_0$. Second inductor 54 may be adapted to allow a signal at fundamental frequency to pass. It may be considered that the second inductor is not a quarter-wavelength transmission line for the fundamental frequency $f_0$. Third inductor 56 may be connected to ground. It may be considered to be a grounding inductor. Between the second inductor 54 and third inductor 56 there may branch off a first fundamental frequency terminal branch 58. It may be considered that the coupling inductors 52, 54 of the third output branch 50 are connected in series with the first fundamental frequency terminal branch 58. In particular, it may be contemplated that the first and second inductors of the third output branch are coupled to each other in series. The first fundamental frequency terminal branch 58 may be considered to be coupled in series to one of the first and second inductors 52, 54, which may be the second inductor 54. The grounding inductor 56 may be considered to be branching off between the first fundamental frequency terminal branch 58 and the coupling inductor 54 connected to it in series. It may be contemplated that the second inductor 54 and third inductor 56 combined essentially represent a quasi-quarter-wavelength transmission line for a signal having the second harmonic frequency $2f_0$. Combined they may provide high impedance for a signal having the second harmonic frequency $2f_0$. The inductors 54 and 56 may be considered as a voltage divider. Via inductors 54 and 56 the output amplitude of the signal having second harmonic frequency $2f_0$ may be increased. Inductor 56 may provide impedance for the signal having fundamental frequency $f_0$. It may be considered that inductor 56 provides moderate impedance for a signal having fundamental frequency $f_0$, as the amplitude of this signal provided by the push-push oscillator core 23 is usually relatively high. In particular, the inductor 56 may be adapted to provide a signal having the fundamental frequency $f_0$ of desired amplitude to the first fundamental frequency terminal branch 58.

A fourth output branch 60 may branch off from the second oscillation branch of the push-push oscillator core 23. The fourth output branch 60 may branch off of a second terminal of the active device of the second oscillation branch. In particular, it may branch off from the collector of second transistor 14. Fourth output branch 60 may comprise a fourth inductor 62, a fifth inductor 64 and a sixth inductor 66. Between the fifth inductor 64 and the third inductor 66 there may branch off a second fundamental frequency terminal branch 68. A second connection point may be provided between the fourth inductor 62 and the fifth inductor 64. Fourth inductor 62 and fifth inductor 64 may be considered to be coupling inductors. It may be envisioned that the fourth inductor 62 is adapted to allow signals having the fundamental frequency $f_0$ and the second harmonic frequency $2f_0$ to pass. In particular, it may be considered to adapt the fourth coupling inductor 62 not to be a quarter-wavelength transmission line for either the fundamental frequency $f_0$ or the second harmonic frequency $2f_0$. It may be envisioned that any of inductors 62, 64, 66 individually or in any combination are adapted for compensating a parasitic capacitance of the push-push oscillator core 23. Inductors 62 and/or 64 and/or 66 may be adapted to provide or improve an output match for one output signal having the fundamental frequency $f_0$ or the second harmonic frequency $2f_0$, or for both output signals having the fundamental frequency $f_0$ and the second harmonic frequency $2f_0$, respectively The quality factor of the tank respectively the oscillation branch may be increased by optimization of the inductors 62, 64 and 66. In particular, the amplitude of an output signal may be increased and/or the phase noise may be minimized, e.g. for the signal having the second harmonic frequency $2f_0$. Fifth inductor 64 may be adapted to allow a signal having fundamental frequency $f_0$ to pass. It may be considered that the fifth inductor 64 is not a quarter-wavelength transmission line for the fundamental frequency $f_0$. Sixth inductor 66 may be connected to ground. It may be considered to be a grounding inductor. The coupling inductors 62, 64 of the fourth output branch 60 may be considered to be coupled in series with the second fundamental frequency terminal branch 68. In particular, it may be contemplated that the fourth and fifth inductors 62, 64 of the fourth output branch 60 are coupled to each other in series. The second fundamental frequency terminal branch 68 may be considered to be coupled in series to one of the fourth and fifth inductors 62, 64, which may be the fifth inductor 64. The grounding inductor 66 may be considered to be branching off between the second fundamental frequency terminal branch 68 and the coupling inductor 64 connected to it in series. It may be contemplated that the fifth inductor 64 and sixth inductor 66 combined essentially represent a quasi-quarter-wavelength transmission line for a signal having the second harmonic frequency $2f_0$. Combined they may provide high impedance for a signal having the second harmonic frequency $2f_0$. The inductors 64 and 66 may be considered as a voltage divider. Via inductors 64 and 66 the amplitude of the signal having second harmonic frequency $2f_0$ may be increased. Inductor 66 may provide impedance for the signal having fundamental frequency $f_0$. It may be considered that inductor 66 provides moderate impedance for a signal having fundamental frequency $f_0$, as the amplitude of this signal provided by the push-push oscillator core 23 is usually relatively high.

In particular, the inductor 66 may be adapted to provide a signal having the fundamental frequency $f_0$ of desired amplitude to the second fundamental frequency terminal branch 68.

Between the second inductor 52 and the third inductor 54 of the third output branch 50 there may branch off a connection branch coupling the first connection point of the third output branch and the second connection point of the fourth output branch. The connection branch may comprise a decoupling line 70. Decoupling line 70 may comprise a first capacitor 72 and a second capacitor 74. First capacitor 72 and second capacitor 74 may have similar, equal or essentially equal capacitances. A connection point 76 between the first capacitor 72 and the second capacitor 74 may be decoupled from a DC component in the circuit 10. Capacitors 72 and 74 may be adapted to provide a signal enhancement for the second harmonics frequency by providing signals having the second harmonic frequency with the same phase at point 76. Capacitors 72 and 74 may be adapted to provide a virtual ground for a signal having fundamental frequency $f_0$ by providing signals having the fundamental frequency $f_0$ with opposite phases at point 76. It may be considered that a second terminal branch 78 is coupled to the connection branch. In particular, connection point 76 of decoupling line 70 may be connected to the second terminal branch 78

Second terminal branch 78 may comprise a phase shifting inductor 80 adapted to phase-shift a signal at second harmonic frequency $2f_0$, to which may be connected in series a second second harmonic terminal 82 at which a signal at the second harmonic frequency $2f_0$ may be provided respectively tapped off. The second harmonic terminal 82 may be considered to output a signal having the second harmonic frequency $2f_0$. The output of the second second harmonic terminal may be considered to be a component of a differential signal. To a connection point between the second second harmonic terminal 82 and the phase shifting inductor 80 there may be coupled a second RF stub 84. Second RF stub 84 may be adapted to shorten out a fundamental frequency $f_0$ signal at terminal 82 and to enhance the signal at the second harmonic frequency $2f_0$. In particular, second RF stub 84 may comprise an inductor 86. Inductor 86 may represent a quarter-wavelength transmission line 86 for signals having the second harmonic frequency $2f_0$. Transmission line 86 may be coupled in series to a capacitor 88 and ground. Second RF stub 84 may provide a short circuit connection for a signal at fundamental frequency $f_0$ and an open circuit connection with high impedance for a signal at second harmonic frequency $2f_0$. Thus, the signal with frequency $2f_0$ provided at the first second harmonic terminal 82 may be improved as it may comprise a weakened component at fundamental frequency $f_0$.

First fundamental frequency terminal branch 58 may comprise a capacitor 90 to decouple terminal branch 58 from a DC component in circuit 10. Coupled in series to capacitor 90 may be a fundamental frequency phase shifting inductor 92, which may be connected in series to a first fundamental frequency terminal 94. The first fundamental frequency terminal 94 may be considered to output a signal having the fundamental frequency $f_0$. The output of the first fundamental frequency terminal 94 may be a component of a differential signal. It may be envisioned that a RF stub is connected to the first fundamental frequency terminal branch 58. The RF stub may comprise an inductor 102, which may be a quarter-wavelength transmission line for a signal having the fundamental frequency $f_0$. The RF stub may comprise a capacitor 104, which may be connected in series between the inductor 102 and ground. It may be considered that the RF stub is connected between the first fundamental frequency terminal 94 and a point at which the first fundamental frequency terminal branch 58 branches off of the third output branch 50. In particular, the RF stub may be connected to a connection point between the first fundamental frequency terminal 94 and the inductor 92.

Second fundamental frequency terminal branch 68 may comprise a capacitor 96 to decouple terminal branch 68 from a DC component in circuit 10. Coupled in series to capacitor 96 may be a fundamental frequency phase shifting inductor 98, which may be connected in series to a second fundamental frequency terminal 100. The second fundamental frequency terminal 100 may be considered to output a signal having the fundamental frequency $f_0$. The output of the second fundamental frequency terminal 100 may be a component of a differential signal. It may be envisioned that a RF stub is connected to the second fundamental frequency terminal branch 68. The RF stub may comprise an inductor 106, which may be a quarter-wavelength transmission line for a signal having the fundamental frequency $f_0$. The RF stub may comprise a capacitor 108, which may be connected in series between the inductor 106 and ground. It may be envisioned that the RF stub is connected between the second fundamental frequency terminal 100 and a point at which the second fundamental frequency terminal branch 68 branches off of the fourth output branch 60. In particular, the RF stub may be connected to a connection point between the second fundamental frequency terminal 100 and the inductor 98.

The third output branch 50 and the fourth output branch 60 may be symmetrical branches. The first inductor 52 may have the same inductance as the fourth inductor 62. The second inductor 54 may have the same inductance as the fifth inductor 64. The third inductor 56 may have the same inductance as the sixth inductor 66. Capacitor 90 of the first fundamental frequency terminal branch 58 may have the same capacitance as capacitor 96 of the second fundamental frequency terminal branch 68.

The inductance of phase shifting inductor 40 of first terminal branch 36 and the inductance of phase shifting inductor 80 may be chosen such that terminals 42 and 82 provide a differential signal at the second harmonic frequency $2f_0$. The capacitance of capacitor 38 may be equal to the capacitance of capacitor 72 and/or capacitor 74.

The inductance of inductor 92 of the first fundamental frequency terminal branch 58 and the inductance of inductor 98 of the second fundamental frequency terminal branch 68 may be adapted such that the first fundamental frequency terminal 94 and the second fundamental frequency terminal 100 provide a differential signal having the fundamental frequency $f_0$.

The fundamental frequency may be in the range between 1 GHz and 10 THz. It may be envisioned that the fundamental frequency lies in the range between 10 GHz and 100 GHz. In particular, the fundamental frequency may be 38.5 GHz. The push-push oscillator circuit is particularly suited for use in an automotive radar system, which may use mm-waves. It may be feasible that any number of the inductors comprise a transmission line. A transmission line may comprise one or more microstrips, or may be embodied as one or more microstrips. A microstrip may be easily implemented on a substrate, in particular a semiconductor substrate, and provides good transmission capabilities in particular in a frequency range of tens of GHz. In particular, it may be envisioned that one or more than one of the coupling inductors of the third output branch 50, e.g. first inductor 52 and/or second inductor 54, comprise a microstrip. One or more of the coupling inductors of fourth output branch 60, e.g. fourth inductor 62 and/or fifth inductor 64 may comprise a microstrip. The grounding inductor 56 and/or the grounding inductor 66 may comprise a microstrip. The inductances for the first inductors 52, 54 and 56 of the third output branch 50 may be adapted to optimize the differential signals having the fundamental frequency $f_0$ and/or the second harmonic frequency $2f_0$ in regards to output power and/or noise level. It may be feasible to use any kind of inductor structure suitable for a given frequency range for any of the inductors. For example, it may be considered to use a coil structure as inductor. It may be envisioned that any one or any number of the inductors comprise or are embodied as co-planar transmission lines.

Inductors 52, 54 and 56 may be seen as providing one transmission line. It may be considered that inductors 62, 64 and 66 provide one transmission line as well. Both transmission lines may be symmetrical. By changing the characteristics of the inductors 52, 54 and 56 respectively 62, 64 and 66, and possible the inductor 80 in the second terminal branch 78 and/or the inductor 40 in the first terminal branch 36, it is possible to optimize a signal having the second harmonic frequency $2f_0$ at the second harmonic frequency terminal 82. In particular, it is possible to provide a complementary differential signal having the same amplitude and opposite phase if compared to the signal provided at the first second harmonic frequency terminal 42. The RF stubs close to the terminals may increase the signal quality and reduce phase noise. Any of the RF stubs may be seen as optional. In particular, it may be envisioned to supply only one terminal branch with a RF stub, e.g. second terminal branch 78. It may also be considered to only provide the first terminal branch 36 and the second terminal branch 78 with RF stubs, or to provide only the fundamental frequency terminal branches 58, 68 with RF stubs. It may also be contemplated that only one terminal branch is not provided with a RF stub, e.g. the second terminal branch 78 or the first terminal branch 36.

The signal provided via first and second second harmonic terminals 42 and 82 may be a differential signal having the second harmonic frequency $2f_0$. The differential signal having second harmonic frequency may be enhanced by RF stubs 44 and 84, which may filter out components at fundamental frequency $f_0$. The push-push oscillator circuit 10 may provide a differential signal at the fundamental frequency $f_0$ via fundamental frequency terminals 94 and 100. To provide these differential signals having the two frequencies $f_0$ and $2f_0$, no additional active device beyond those of the push-push oscillator core 23 are necessary. It is also not required to implement additional frequency dividers or multipliers. As additional active devices add to phase noise, it is thus possible to provide signals at lower noise level. The push-push oscillator circuit described is compact and may be easily adapted to provide desired signal characteristics by changing the inductances of the inductors of the third and fourth output branches, namely the inductors 52, 54, 56, 62, 64 and 66. By changing the characteristics of these inductors, it is possible to optimize the output power of the differential signals at the terminals and the noise level of the differential signals. The differential signals provided are robust against changes in the tuning voltage $V_{tune}$. The push-push oscillator circuit is power-efficient, as it may provide its differential signals without additional power-hungry active devices.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

The connections or couplings as discussed herein may be any type of connection or coupling suitable to transfer signals from or to the respective nodes, units or devices, for example via intermediate devices. The terms coupling and connection respectively coupled and connected may be used interchangeably. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, an inductor and a resistor may be integrated into one element.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, all the components of the push-push oscillator circuit may be integrated on one substrate. Alternatively, the examples may be implemented as any number of separate integrated circuits or separate devices interconnected with each other in a suitable manner. For example, one or more than one of the output branches may be provided partially or completely on a substrate different from the substrate the push-push oscillator core is provided on.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A push-push oscillator circuit, comprising:
   a first output terminal to provide a first component of a differential signal having a fundamental frequency $f_0$;
   a second output terminal to provide a second component of the differential signal having the fundamental frequency $f_0$;
   a third output terminal to provide a first component of a differential signal having a second harmonic frequency $2f_0$;
   a fourth output terminal to provide a second component of the differential signal having the second harmonic frequency $2f_0$;
   a first oscillation branch with a first active device and a first tank adapted to provide a signal having the fundamental frequency $f_0$;
   a second oscillation branch with a second active device and a second tank symmetrical to the first oscillation branch and adapted to provide a signal having the fundamental frequency $f_0$;

output branches coupled to the first oscillation branch and the second oscillation branch to provide signals having the second harmonic frequency $2f_0$ based on signals having the fundamental frequency $f_0$ and/or to provide signals having the fundamental frequency $f_0$; and at least one terminal branch including a RF stub comprising a quarter-wavelength transmission line and a corresponding capacitor for a signal having the second harmonic frequency $2f_0$ or the fundamental frequency $f_0$.

2. The push-push oscillator circuit according to claim 1, wherein the quarter-wavelength transmission line for a signal having the second harmonic frequency $2f_0$ or the fundamental frequency $f_0$ of the RF stub comprises a microstrip.

3. The push-push oscillator circuit according to claim 2, wherein the RF stub is coupled to a connection point between an inductor of the at least one terminal branch and the terminal.

4. The push-push oscillator circuit according to claim 2, wherein the RF stub comprises a capacitor coupled in series with the quarter-wavelength transmission line.

5. The push-push oscillator circuit according to claim 1, wherein the RF stub is coupled to a connection point between an inductor of the at least one terminal branch and the terminal.

6. The push-push oscillator circuit according to claim 1, wherein the RF stub comprises a capacitor coupled in series with the quarter-wavelength transmission line.

7. The push-push oscillator circuit according to claim 1, wherein the fundamental frequency $f_0$ lies in a range between 10 GHz to 10 THz.

8. A push-push oscillator circuit, comprising:

a first oscillation branch with a first active device and a first tank adapted to provide a signal having a fundamental frequency $f_0$;

a second oscillation branch with a second active device and a second tank, the second oscillation branch symmetrical to the first oscillation branch and adapted to provide a signal having the fundamental frequency $f_0$;

a first output branch coupled to the first oscillation branch, the first output branch including a first coupling inductor connected between the first oscillation branch and a first connection point, a second coupling inductor connected between the first connection point and a second connection point, and a first fundamental frequency branch connected between the second connection point and a first fundamental frequency terminal, the first fundamental frequency terminal to provide a first component of a differential signal having a fundamental frequency $f_0$; and a second output branch coupled to the second oscillation branch, the second output branch including a third coupling inductor connected between the second oscillation branch and a third connection point, a fourth coupling inductor connected between the third connection point and a fourth connection point, and a second fundamental frequency branch connected between the fourth connection point and a second fundamental frequency terminal, the second fundamental frequency terminal to provide a second component of the differential signal having the fundamental frequency $f_0$.

9. The push-push oscillator circuit according to claim 8, further comprising:

a first terminal branch including a first second harmonic frequency terminal, the first second harmonic frequency terminal to provide a first component of a differential signal having a second harmonic frequency $2f_0$; and a second terminal branch including a second second harmonic frequency terminal, the second second harmonic frequency terminal to provide a second component of the differential signal having the second harmonic frequency $2f_0$;

wherein the first terminal branch is connected to the first connection point by a first capacitor, and is connected to the third connection point by a second capacitor; and wherein the second terminal branch is connected to the first oscillation branch by a third output branch, and is connected to the second oscillation branch by a fourth output branch.

10. The push-pull oscillator of claim 9, further comprising:

a second RF stub connected between the first second harmonic frequency terminal and a ground, the first RF stub including a quarter-wave transmission line for a signal having the second harmonic frequency $2f_0$.

11. The push-push oscillator circuit according to claim 9, wherein the second terminal branch includes a decoupling capacitor connected in series with an inductor, the inductor to provide a phase shift.

12. The push-push oscillator circuit according to claim 8, wherein the first connection point and the third connection point are coupled via a connection branch including a first capacitor and a second capacitor.

13. The push-push oscillator circuit according to claim 12, wherein the first capacitor and the second capacitor are adapted to provide signals having the second harmonic frequency $2f_0$ with the same phase.

14. The push-push oscillator according to claim 8, wherein each of the first, second, third, and fourth coupling inductors comprise a microstrip.

15. The push-push oscillator circuit according to claim 8, further comprising a first grounding inductor connected between the second connection point and a ground, and a second grounding inductor connected between the fourth connection point and ground.

16. The push-push oscillator according to claim 15, wherein each of the first grounding inductor comprises a microstrip and the second grounding inductor comprises a microstrip.

17. The push-push oscillator circuit according to claim 8, wherein the fundamental frequency $f_0$ lies in a range between 10 GHz to 10 THz.

18. The push-pull oscillator of claim 8, further comprising:

a first RF stub connected between the first fundamental frequency terminal and a ground, the first RF stub including a quarter-wave transmission line for a signal having the fundamental frequency $f_0$.

19. The push-pull oscillator of claim 8, further comprising:

a third output branch including an inductor connected between the first oscillation branch and a fifth connection point;

a fourth output branch including an inductor connected between the second oscillation branch and the fifth connection point; and a biasing branch connected to the fifth connection point, the biasing branch including a quarter-wave transmission line for a signal having the second harmonic frequency $2f_0$.

* * * * *